United States Patent [19]

Trump

[11] 4,142,794
[45] Mar. 6, 1979

[54] STEP AND REPEAT SYSTEM

[75] Inventor: Dennis H. Trump, Nashua, N.H.

[73] Assignee: Nashua Control Instruments, Nashua, N.H.

[21] Appl. No.: 765,242

[22] Filed: Feb. 3, 1977

[51] Int. Cl.² .................. G03B 27/20; G03B 27/04
[52] U.S. Cl. ................................. 355/92; 355/95; 355/75
[58] Field of Search .............. 355/95, 92, 72, 75, 355/53, 86, 87, 93, 96, 54, 73, 76

[56] References Cited
U.S. PATENT DOCUMENTS

| 954,920 | 4/1910 | Huebner | 355/86 |
|---|---|---|---|
| 2,974,579 | 3/1961 | Echelson et al. | 355/95 |
| 3,639,059 | 2/1972 | Strumor et al. | 355/53 X |
| 3,840,300 | 10/1974 | Vane | 355/86 X |
| 4,047,813 | 9/1977 | Spence-Bate | 355/54 |

Primary Examiner—L. T. Hix
Assistant Examiner—W. J. Brody
Attorney, Agent, or Firm—Schiller & Pandiscio

[57] ABSTRACT

A step-and-repeat registration system is disclosed for making multiple-image plates for use in flexographic printers or the like. The negative which carries the image to be transferred to a light-sensitive film, is referenced with respect to a fixed frame. An incremental step registration system accurately positions the film at a succession of predetermined stations to bring different portions of the film opposite the negative. At each station the film is brought into contact with the negative and an exposure is made on the pertinent film portion, using a light source to project the image onto the film. The registration system provides high accuracy and lends itself to partial or complete automation.

27 Claims, 7 Drawing Figures

STEP AND REPEAT SYSTEM

BACKGROUND OF THE INVENTION

Letter press printing is a commonly used process wherein the printing surface of the printing plate stands out in relief and the non-printing parts are positioned below the printing surface. For high production letter press printing, rotary presses are employed in which each printing cylinder may carry several identical plates. As employed here, the term plate may also refer to an assembly of plates, or to an assembly of type and plates, as required to compose a single page. During each revolution, the cylinder will print as many impressions, (e.g. pages), on one side of the sheet which passes in contact with the cylinder, as the number of plates carried by it. Where more than one color is to be printed, separate cylinders each carrying a plate corresponding to a particular color are required. The cylinders must be accurately aligned with each other so that the plates will be in proper registration with each other. If multiple plate printing is carried out, the separate plates on successive cylinders that correspond to the different colors of a single impression must be in registration to assure that the different colors will appear in their appropriate precise location in the printed impression.

In the past and to some extent in current practice, the components that are to be assembled into a plate for printing one color of a single page, are locked in a metal frame that holds all the elements of the page securely in place. Papier mache, or the like, is placed over the assembled parts of the page and is squeezed down by hydraulic or mechanical pressure to form a stereotype matrix of the page. From the latter a stereotype plate is cast, usually in semicylindrical form, for mounting on the press cylinder of a rotary press.

More recently, a new technique has been developed wherein the stereotype plate is made of molded rubber or plastic and is disposed on a flexible mounting that can be fastened around the printing cylinder of a rotary press. Stereotypes made by this process are commonly referred to as flexographic plates or films and they can be made by a photographic process using a film that is sensitive to light. For example, the film may consist of a photopolymeric material which, when exposed to light shined through the negative of the image it is desired to transfer to the film, hardens where exposed. The non-exposed portions are subsequently removed by a chemical process, or otherwise, to leave the desired image in relief on the film.

Where multiple printing of the same image during each rotation of the print cylinder is required, as may be the case where labels are mass produced, the desired image must be provided on separate, precisely located portions of the flexographic film. This is done by accurately positioning the film at a succession of stations, using a step-and-repeat registration system in order to bring the different portions of the film opposite the original image-bearing sheet. The latter may be a negative or a diapositive, as the case may be. An image can then be formed on the film either through the use of imaging optics or by contact printing. The former is relatively more expensive than contact printing and often does not provide a sharply defined image.

When contact printing is carried out, in order to avoid damage to the film or to the original image-bearing sheet, film positioning must occur only when the two sheets are out of contact with each other. In order to provide an accurate image transfer, i.e. an accurately positioned exposure, the film is brought proximate the original image-bearing sheet at each station prior to being exposed to light. After the exposure is completed, the film is again spaced from the image-bearing sheet and thus transported to the next station.

Although various registration systems are in use today for carrying out the positioning process outlined above for contact-printing, many of them are considered to be cumbersome in use and difficult to service. As a result, the process of making a multiple-image, flexographic plate or film has heretofore tended to consume an undue amount of time. Further, presently available equipment is frequently unable to provide, reliably and repeatably, the accuracy required for proper color registration, i.e. a registration accuracy of the order of 3 mils or less. To the extent that such registration accuracy has been achieved, prior art apparatus capable of performing within these limits is costly, thereby offsetting the advantages of economy inherent in mass production flexographic printing.

A further failing of prior art registration systems resides in the lack of flexibility of such systems for operation in different modes. Clearly, whatever mode best suits the particular job requirements, e.g. manual, semi-automatic, or fully automatic operation will provide the best results at the lowest cost. However, prior art registration systems are usually dedicated to only one of these operating modes and hence unable to take advantage of different types of situations.

OBJECTS OF THE INVENTION

It is the primary object of the present invention to provide a step-and-repeat registration system for making flexographic films and plates which is not subject to the disadvantages of prior art systems.

It is another object of the present invention to provide a simple and economical step-and-repeat registration system which is capable of registration accuracies of the order of 3 mils or less.

It is a further object of the present invention to provide an economical step-and-repeat registration system which is simple to operate and to service.

It is still another object of the present invention to provide a simple step-and-repeat registration system which is less costly than heretofore available systems of this type.

It is still a further object of the present invention to provide a flexible step-and-repeat registration system which lends itself selectively to manual, semi-automatic and fully automatic operation.

SUMMARY OF THE INVENTION

In the step-and-repeat registration system which forms the subject matter of the present invention a frame is provided to which the stationary image-bearing sheet such as a negative is positionally referenced. A stage is disposed within the frame and is capable of moving by step increments in orthogonal directions to a succession of predetermined stations. The stage comprises two superposed portions, the upper stage portion carrying the photopolymeric film. At each station a different portion of the film is positioned opposite the negative for exposure thereto. The upper stage portion is selectively raised with respect to the lower stage portion so as to bring the aforesaid film portion proximate the negative. As light source is selectively activated in order to expose or "burn in" the image on the appropriate plate portion. Upon completion of the image-forming operation at successive stations, the stage returns to a predetermined home position.

These and other objects of the present invention together with the features and advantages thereof will become apparent from the following detailed specification, when read in conjunction with the accompanying drawings.

DESCRIPTION OF THE INVENTION

Figure 1:
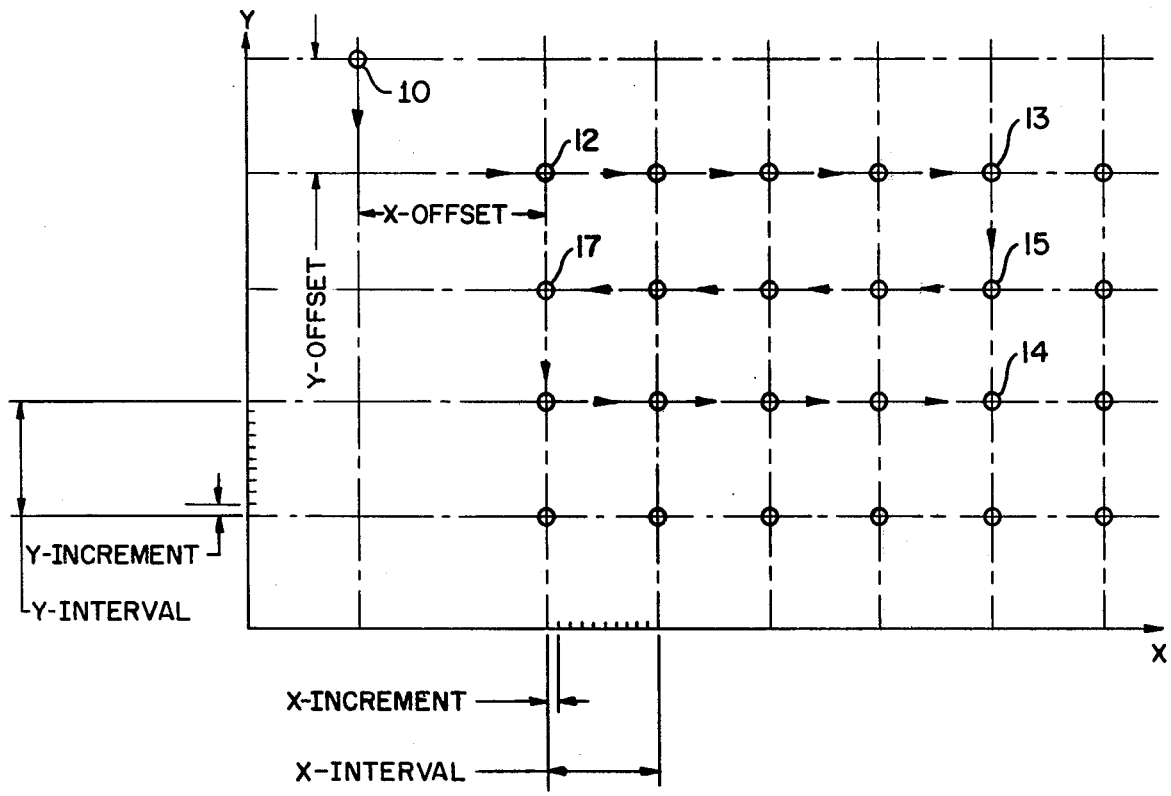
FIG. 1 illustrates an orthogonal grid of stations and an exemplary path followed by the stage.

With reference now to the drawings, FIG. 1 illustrates an orthogonal grid or matrix of stations. The negative, which comprises a movable transparent sheet, may be transported to a pre-selected succession of stations along a chosen path. For convenience, the X axis marks longitudinal distances and directions, while the Y axis marks latitudinal distances and directions. The distances between successive stations along the X and Y axes respectively are designated as intervals, each interval being further subdivided into a predetermined number of step increments not limited to the number shown. In a preferred embodiment of the invention, the X and Y intervals have the same magnitude. Likewise, X and Y step increments have the same magnitude.

Reference numeral 10 designates the home position of the movable stage and marks the beginning of the preselected path to be traversed by the latter. The path is indicated by arrows in FIG. 1 and is seen to extend in orthogonal directions to a final station designated by the reference numeral 14. Home position 10 is offset in the X and Y directions respectively, from a start position 12 which represents the first station along the aforesaid path. Although the invention is not so limited, it will be noted that the path in the example illustrated in FIG. 1 encompasses only a portion of the total grid or matrix of stations represented in FIG. 1.

FIGS. 2 to 5 illustrate in various degrees of detail the mechanical aspects of the step-and-repeat registration system which forms the subject matter of the present invention. With reference to the isometric view of FIG. 2, it will be noted that a number of symmetrically disposed pairs of substantially identical parts are used in the apparatus there illustrated, with only one part of the pair showing. Each such occurrence is specifically pointed out to make clear that a symmetrical pair exists.

A frame 20 comprises a control panel 21. A cover 22 is movably coupled to the frame by means of a piano hinge 24 and includes a transparent pane 26. When closed, cover 22 is adapted to be fastened by cooperating latches 113 and clamps 116, such that interlock switch 118 is depressed.

Figure 2:
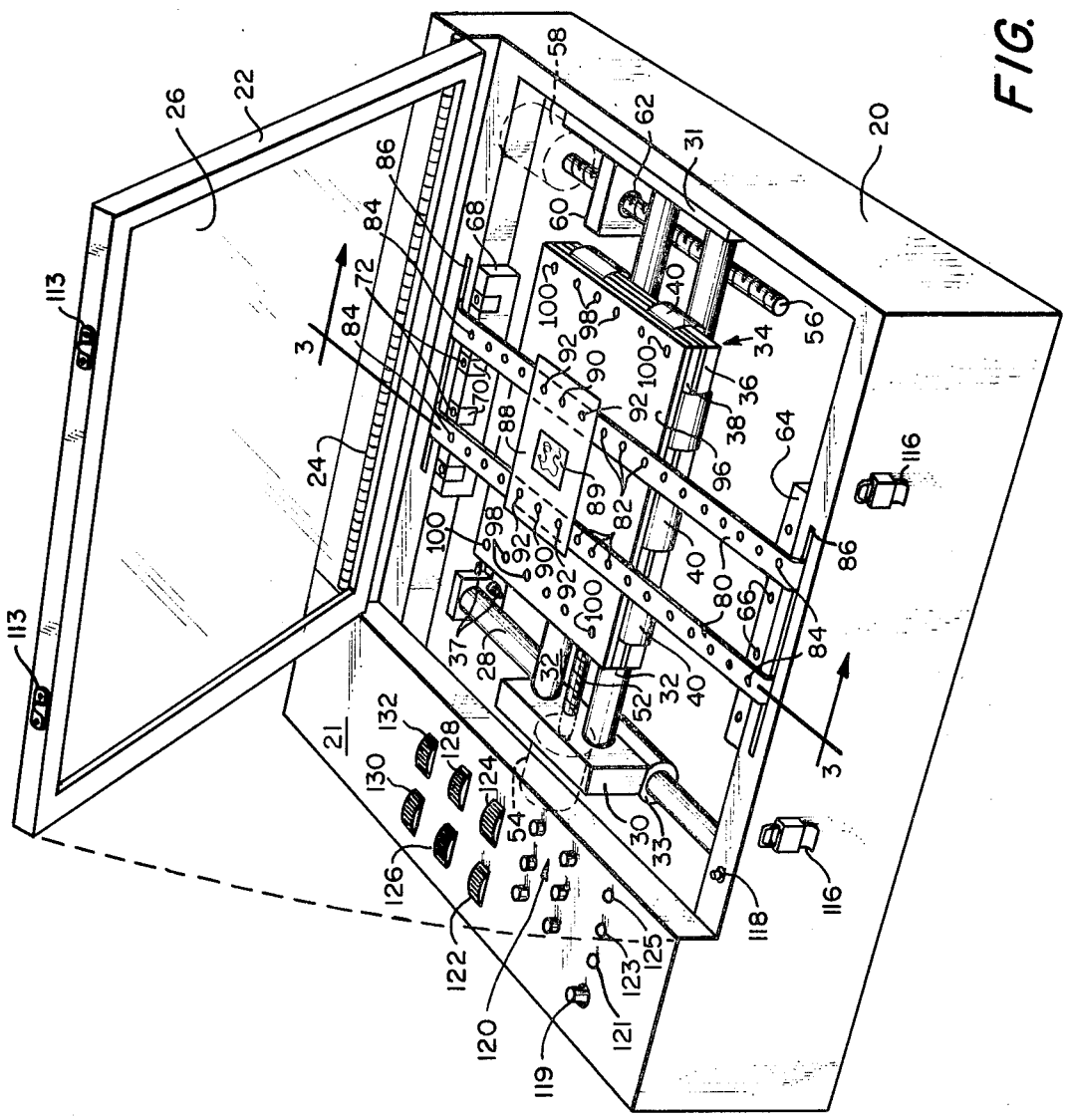
FIG. 2 is an overall view of a preferred step-and-repeat system.

Mounted within the hollow frame portion near opposite sides thereof is a pair of ways 28, only one of which is visible in the isometric view of FIG. 2. Following the designation of the respective orthogonal directions of FIG. 1, ways 28 extend in the Y direction between the front and back surfaces of the hollow frame portion. A pair of blocks 30 and 31 is mounted on ways 28, each block terminating in an extension 33, (as shown with respect to block 30 only), which slidably receives one of the aforesaid ways. Thus, blocks 30 and 31 are free to move in the Y direction.

Figure 5:
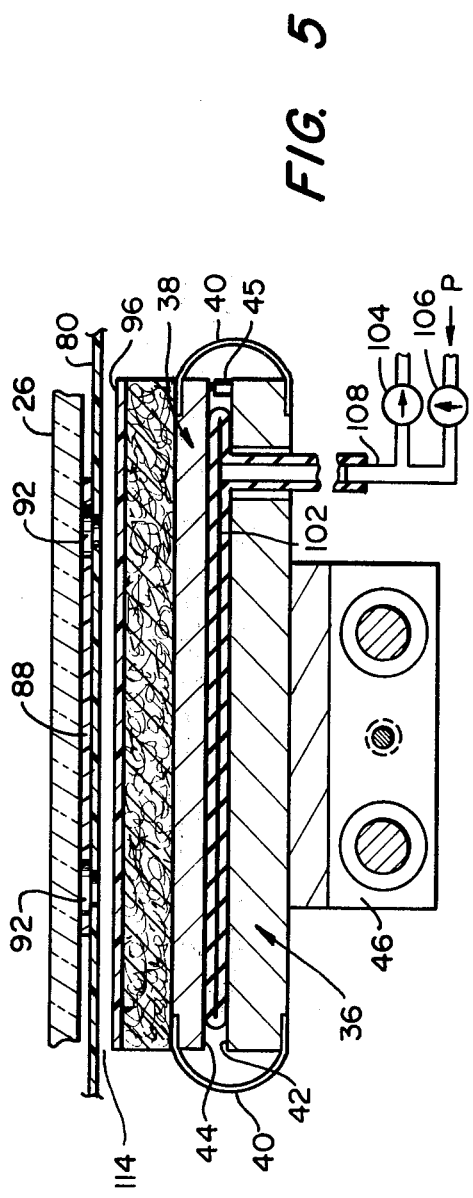
FIG. 5 illustrates another operating condition of the apparatus of FIG. 3.

A second pair of ways 32 extends in the X direction between blocks 30 and 31. A stage generally designated by reference numeral 34, comprises lower and upper substantially flat stage portions 36 and 38 respectively. A pair of position switches 37 is positioned at the home position of the stage and is adapted to be depressed when stage 34 is in its home position. As shown clearly in FIGS. 3 and 5 the two stage portions, which include mutually facing parallel surfaces 42 and 44, are coupled together on all sides by means of a set of curvilinear leaf springs 40. The leaf springs permit relative motion of the stage portions substantially only in a direction normal to surfaces 42 and 44 and they are preferably set into the respective stage portions flush with the outside surfaces thereof. In their relaxed position, springs 40 maintain stage portions 36 and 38 substantially as shown in FIG. 5, with surfaces 42 and 44 spaced from each other as illustrated. A switch 45 is positioned between the two surfaces, so as to be depressed when the spacing is as shown in FIG. 5.

Figure 4:
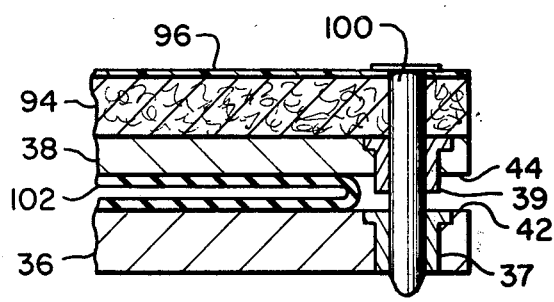
FIG. 4 is a fragmentary cross-sectional view of the apparatus of FIG. 2.
Figure 3:
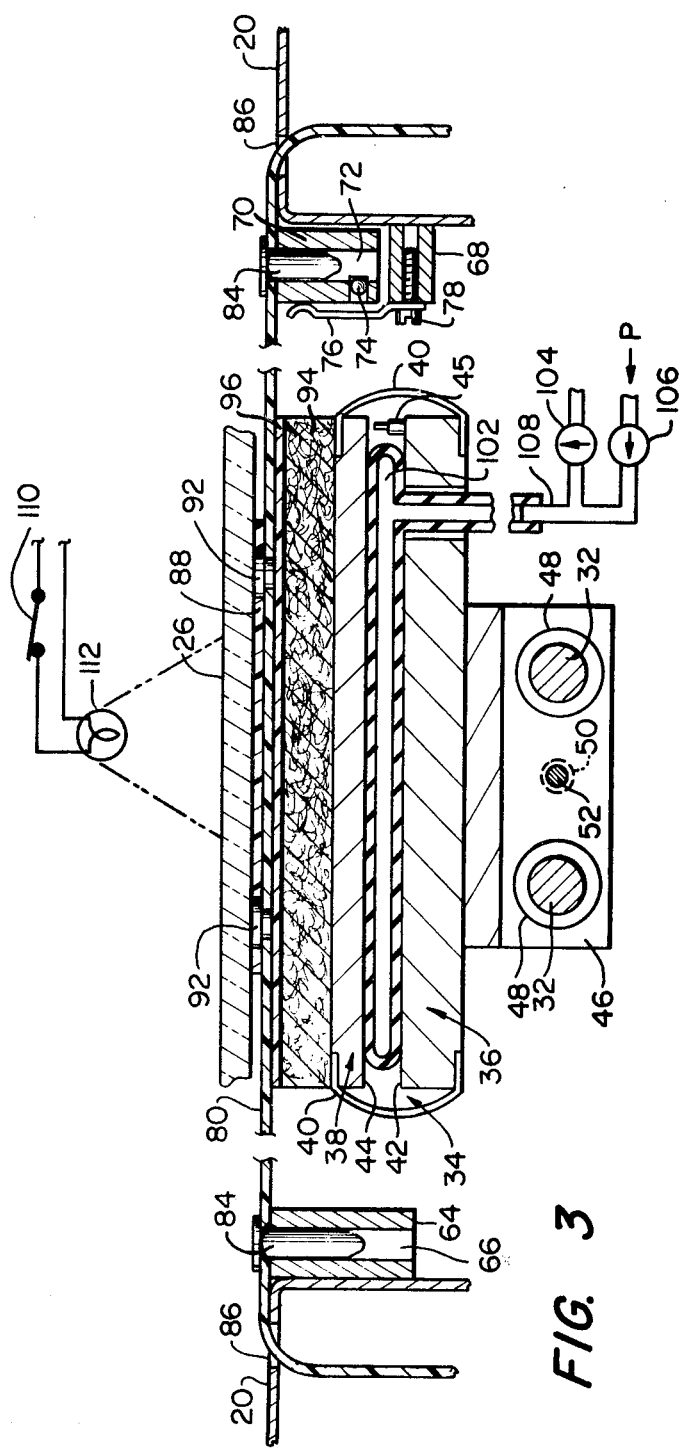
FIG. 3 is a partial cross-sectional view taken at line 3 — 3 of FIG. 2.

As best seen from FIG. 4, stage portions 36 and 38 each include a set of bushings 37 and 39. The bushings of each stage portion are located at opposite edges of the latter and they are mutually spaced one inch on centers in a preferred embodiment of the invention. Further, the bushings are in registry with the corresponding bushings of the other stage portion. Stage portion 36 includes a lower extension 46 as best seen in FIGS. 3 and 5, which slidably receives ways 32 in a pair of bores 48. Extension 46 further includes an internally threaded bore 50 which is adapted to engage a lead screw 52 affixed to block 30 and extending therefrom in the X direction. In a preferred embodiment of the invention, lead screw 52 is preloaded so as to obviate any play between it and threaded bore 50.

A stepping motor 54, located behind the left-hand wall and shown in phantom outline in FIG. 2, is mechanically coupled to lead screw 52. Motor 54 is adapted to be pulsed to impart successive increments of rotation to lead screw 52. Thus, motor 54 constitutes an X drive which advances stage 34 in step increments along the X direction due to the coupling between lead screw 52 and internally threaded bore 50. In a preferred embodiment of the invention, the X drive is pulsed at 20,000 puleses per minute, each pulse advancing stage 34 by 1/1000 inch. An exemplary grid may measure 8 × 12 inches so that 8000 step increments in the Y direction and 12000 step increments in the X direction are required for stage 34 to completely traverse the grid.

Referring again to FIG. 2, a second lead screw 56 extends in the Y direction from the back wall of the hollow frame portion. Lead screw 56 is coupled to a stepping motor 58 located behind the back wall of frame 20 and shown in phantom outline in FIG. 2. Stepping motor 58 which consitutes a Y drive is substantially identical in construction to the X drive.

A block 60 extends into the frame from below block 31 to which it is rigidly secured. Block 60 includes an internally threaded bore 62 which is threadedly engaged by lead screw 56, the latter being preferably pre-loaded to eliminate play between it and bore 62. Lead screw 56 and block 60 are both positioned low enough within frame 20 to provide clearance for lower stage portion 36 when stage 34 moves to the right on ways 32. Stepping motor 58, when pulsed, imparts incremental rotation to lead screw 56 to advance block 60 in step increments in the Y direction. Since block 60 is secured to block 31 and the latter is coupled to block 30 via ways 32, Y drive 58 will advance blocks 30 and 31 in unison along ways 28 on which they are slidably disposed. Accordingly, stage 34 will be advanced in step increments in the Y direction for each incremental rotation of the Y drive.

A tape mounting block 64 is fastened to the front inside surface of frame 20 and includes a plurality of precisely spaced holes 66. In a preferred embodiment of the invention the holes are spaced one inch on centers. A second tape mounting block 68 is fastened to the rear inside surface of frame 20 opposite block 64. Block 68 includes a plurality of block inserts 70 each including a hole 72 positioned opposite a corresponding one of holes 66. As best seen from FIG. 3, each block insert 70 is adapted to pivot about a pivot pin 74. A spring 76 is fastened to block 68 by means of a screw 78 which engages frame 20. Spring 76 resiliently urges block insert 70 to the position shown in FIG. 3.

A pair of thin, dimensionally stable tapes 80 each contain a plurality of precisely spaced holes 82. In a preferred embodiment of the invention, the holes are spaced one half inch on centers. Each tape extends between a corresponding pair of holes 66 and 72 respectively and is fastened therein by means of tape locating pins 84. Due to the action of springs 76 which urge block inserts 70 to their upright position, tension is maintained in each tape span between pins 84. Frame 20 further includes a pair of slots 86 each of which is adapted to receive the loose ends of tapes 80 extending beyond the tape span. The two tape spans thus define a horizontal plane in which tape holes 82, because of their accurate spacing, provide a precise position reference.

The negative comprises a stationary sheet 88 positioned on tapes 80 and bearing a negative image 89. Sheet 88 includes a plurality of accurately spaced holes 90 positioned along opposite edges of the sheet. Holes 90 preferably have a spacing on centers identical to that of tape holes 82, but a diameter larger than that of the tape holes. A set of tape locating buttons 92 are used to fasten sheet 88 down on tapes 80. As best seen from FIGS. 3 and 5, the shank of buttons 92 engages tape holes 82, while the button heads snugly seat within holes 90 such that they are flush with the top surface of negative 88.

A resilient pad 94 is fastened to the top surface of upper stage portion 38. A movable sheet 96 in the form of a light-sensitive film, e.g. a photopolymeric film in a preferred embodiment of the invention, is positioned on top of resilient pad 94. Film 96 includes a plurality of accurately spaced holes 98 which are spaced one inch on centers in a preferred embodiment of the invention.

holes 98 are in registry with bushings 37 and 39 of stage portions 36 and 38 respectively, as well as with corresponding holes in resilient pad 94. Film 96 is fastened down on the upper stage by means of a plurality of film locating pins 100, each pin removably engaging a film hole 98, a corresponding hole in pad 94 and a pair of bushings 39 and 37, all as shown in FIG. 4. For reasons that will become apparent hereinafter, pin 100 slidably engages bushing 37.

An inflatable bag 102 is positioned between surfaces 42 and 44 and is connected to a dump valve 104 and a pressure valve 106 by way of a conduit 108. In FIG. 5, bag 102 is shown in its collapsed (exhausted) condition, with dump valve 104 open and pressure valve 106 closed. In that condition, curvilinear springs 40 are in their relaxed position and maintain a spacing between surfaces 42 and 44, as shown. Further, the collapsed condition of bag 102 opens a spacing 114 between film 96 and negative 88, as illustrated in FIG. 5.

in order to inflate bag 102, the setting of the valves is reversed, exhaust valve 104 being closed and pressure valve 106 being open, as shown in FIG. 3. With cover 22 in its closed position such that glass pane 26 bears against negative 88, pressurized air from source P is admitted to bag 102. The latter inflates and increases the spacing between surfaces 42 and 44 against the action of leaf springs 40. the foregoing action raises upper stage portion 38, thereby closing up spacing 114 and bringing film 96 into contact with negative 88. The presence of pad 94 assures that film 96 is resiliently urged against negative 88.

FIG. 4 illustrates the action of film locating pins 100 when bag 102 is inflated. As previously mentioned, each pin 100 slidably engages a bushing 37. As the spacing between surfaces 42 and 44 increases due to the elevation of upper stage portion 38, pins 100 serve as guides which further assure that this action introduces no motion in the X or Y directions. Therefore, when an exposure is subsequently made, film 96 is stationed at the precise position determined by the position of lower stage portion 36 relative to frame 20.

As shown in FIG. 3, a light source 112 is positioned above negative 88 and is spaced from glass pane 26. A switch 110 is adapted to activate the light source to provide the desired exposure of the portion of film 96 which is then positioned opposite the image on the negative. Pane 26 may be masked to limit the impinging light to the desired film portion. Alternatively, light source 112 may be made to cast a sufficiently narrow beam to accomplish the same objective.

It will be understood that tapes 80 remain interposed between negative 88 and film 96 when stage portion 38 is elevated. However, the tapes are sufficiently thin so that their thickness can be disregarded and contact between negative 88 and film 96 is made for all practical purposes.

Panel 21 contains the external controls for the operation of the step-and-repeat registration system. A power switch 119 is adapted to energize the system. A warning light 121 indicates that interlock switch 118 is open. Light 123 is responsive to switch 45 and indicates that upper stage portion 38 is in its raised position, i.e. as shown in FIG. 3. As explained above, the stage may not be moved in the X and Y directions when this condition pertains. Light 125 is repsonsive to switches 37 and indicates that stage 34 is not in its home position.

Thumb wheel switches 122 and 124 are adapted to set the number of step increments between successive stations in the X and Y directions respectively, as illustrated in FIG. 1. More specifically, the setting of these switches determines the number of step increments comprising an X and Y interval respectively. As pointed out above, all X intervals are of the same length. Similarly, all Y intervals are of the same length. In a preferred embodiment of the invention, the length of X and Y intervals is the same.

Thumb wheel switches 126 and 128 are adapted to set the number of X and Y intervals respectively, that are required to cover all the stations at a given latitude and longitude respectively, along the pre-selected path. Thumb wheel switches 130 and 132 are adapted to set the number of step increments in the X and Y offset distances respectively, i.e. between home position 10 and start position 12, as shown in FIG. 1. Override switches 120 are adapted to override the settings of the aforesaid thumb wheel switches when manual or semi-automatic operation is desired.

The operation of the step-and-repeat registration system illustrated in FIGS. 2-5 will now be explained with the aid of FIG. 6 which illustrates an exemplary implementation of a control system for providing fully automatic operation. Wherever applicable, reference numerals have been carried forward from FIGS. 2-5. It will be clear that the operation about to be described using a fully automatic control system may also be carried out manually, semi-automatically and fully automatically, depending on how many of the automatic functions are overridden by means of switches 120.

Once light-sensitive film 96 and negative 88 are in place, cover 22 is closed and is secured on the frame by cooperating latches 113 and clamps 116. Power is turned by depressing switch 119. Thumb wheel switches 130 and 132 are set to the desired values to determine the X and Y offset distances. Thumb wheel switches 126 and 128 are set in accordance with the number of stations at which stage 34 is to be positioned for exposures. Thumb wheel switches 122 and 124 are set in accordance with the number of X and Y step increments between successive stations in the X and Y directions respectively. A visual check of warning lights 121, 123 and 125 is made to determine whether the cover is properly closed; whether the stage is in its home position; and whether the upper stage portion is in its own position.

Figure 6:
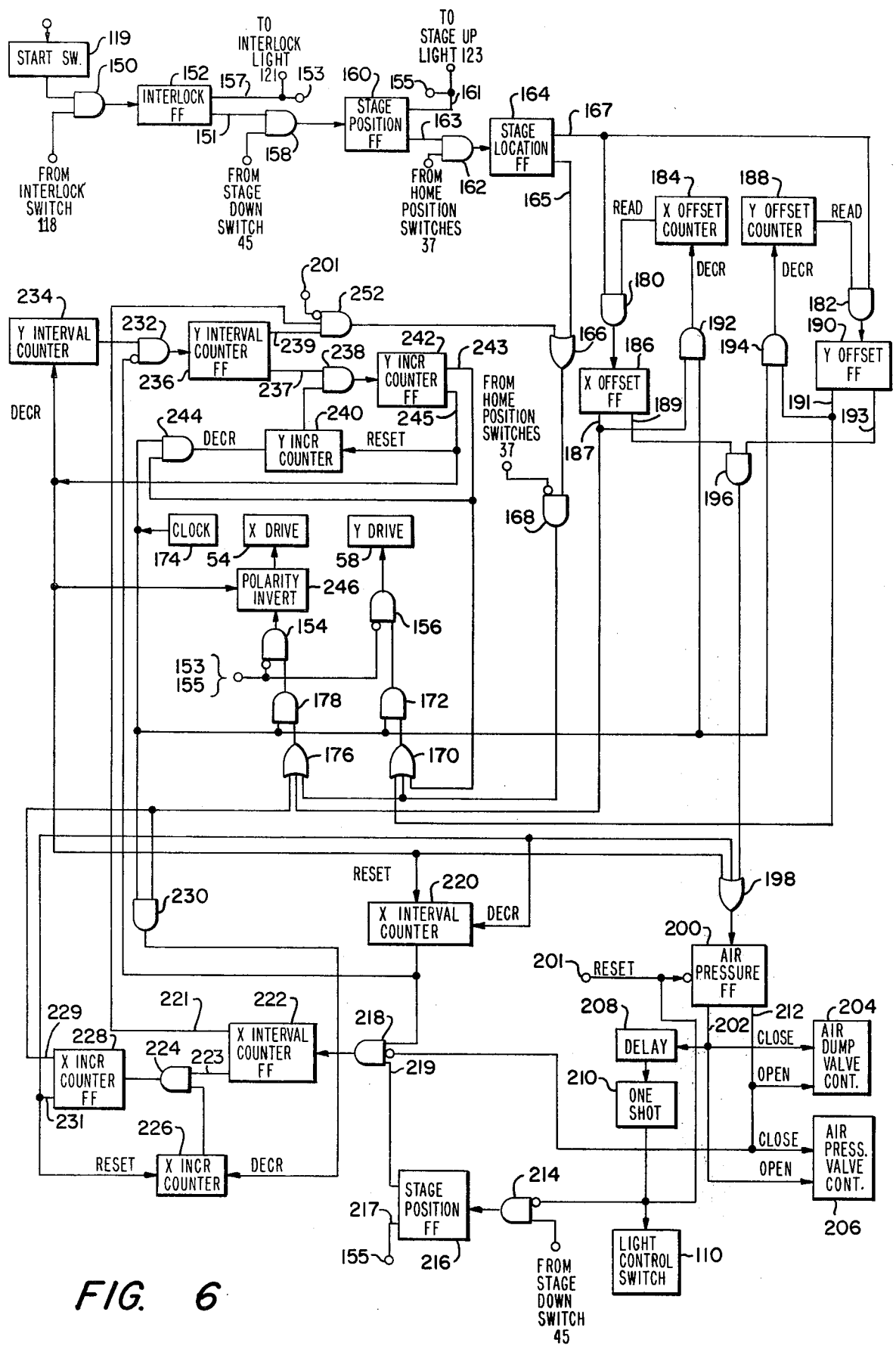
FIG. 6 is a logical block diagram of an exemplary control system for fully automatic operation of the apparatus of FIG. 2.

With reference now to FIG. 6, when start switch 119 is depressed, AND gate 150 remains disabled as long as interlock switch is not depressed. Thus, output 157 of interlock flip-flop 152 will activate interlock warning light 121 and apply a signal to terminal 153. The latter is connected to an inverting input of disable gates 154 and acts to inactivate X and Y drives (stepping motors) 54 and 58.

Once the appropriate interlock switch signal is applied to AND gate 150, output 151 of interlock flip-flop 152 becomes active to apply a signal to one input of AND gate 158. The latter gate is connected to a stage position flip-flop 160 and will signal to the latter if switch 45, which is connected to one input of gate 158, provides a suitable signal to indicate that stage 34 is in its down position. In the absence of a signal from switch 45, output 161 of stage position flip-flop 160 energizes warning light 123 and a signal is sent by way of terminal 155 to AND gates 154 and 156 to disable the X and Y drives.

If flip-flop 160 is actuated, the resultant signal on output 163 is applied to one input of AND gate 162. If stage 34 is not in its home position, switches 37 will fail to provide a signal to the other input of gate 162 and the gate remains open.

The output of AND gate 162 is connected to a stage location flip-flop 164. Output 165 of flip-flop 164 is connected to an OR gate 166 and will apply a signal thereto as long as gate 162 remains non-conductive, i.e. as long as one of home position switches 37 remains open indicative of the fact that stage 34 is not at its home position. The output of OR gate 166 is applied to an AND gate 168 which further receives the inverted output signal of switches 37.

Under the described conditions, AND gate 168 is activated and its output is applied to a pair of OR gates 170 and 176. The output of the gates 170 and 176 are applied to one input each of a further pair of AND gates 172 and 178 respectively, each of which receives an additional input from a clock 174 adapted to provide timing pulses. Thus, gates 172 and 178 provide output pulses to gates 156 and 154 respectively to cause the latter, (if not disabled), to apply suitable signals to the X and Y drives in clock synchronism. A polarity inverting circuit 246, which is connected between the output of gate 154 and the X drive, is assumed to remain inactive for purposes of the present explanation and therefore has no effect on the X drive during this operation. X and Y drives 54 and 58 are thus energized and remain active until stage 34 is stepped back to home position 10.

When the home position is reached, switches 37 are activated, gate 162 becomes conductive and flip-flop 164 is switched to provide a signal on output 167 which is applied to one input of each of a pair of AND gates 180 and 182. A second input of gate 180 is energized from the output of an X offset counter 184 which contains a predetermined initial count set by thumb wheel switch 130.

Figure 7:
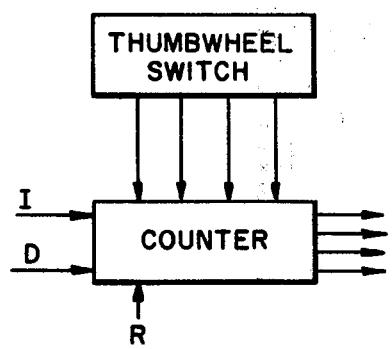
FIG. 7 illustrates an exemplary counter for use in the present invention.

Counter 184 may constitute a conventional up/down counter, such as shown in FIG. 7. As illustrated, an electrically encoded initial count may be set into the counter by means of the connected thumb wheel switch. Thereafter, depending on the signals applied to the counter inputs I and D, the pre-set count set by the thumb wheel switch is either decremented or incremented. In conventional manner, the counter may be arranged to provide a suitable output signal when a predetermined count, e.g. the count of zero, is reached. The counter is reset to its original setting by applying an appropriate signal on input R. It will be understood that the number of connecting lines shown in FIG. 7 is exemplary only and will depend on the magnitude of the count that must be accommodated.

Referring back to FIG. 6, the output of counter 184 remains active as long as the count remains other than a predetermined value, e.g. a zero count in a preferred embodiment of the invention. Thus, gate 180 becomes conductive and actuates an X offset flip-flop 186.

A Y offset counter 188, which may be identical in construction to counter 184, is pre-set to a predetermined count by its associated thumb wheel switch 132. The output of counter 188 is applied to the other input of gate 182 to render the latter conductive and apply an input to Y offset flip-flop 190.

As long as gates 180 and 182 are conductive, outputs 187 and 191 of flip-flops 186 and 190 respectively are active so as to apply signals to one input of each of a pair of AND gates 192 and 194. Upon each occurrence of a clock pulse, gates 192 and 194 each apply an output pulse to counters 184 and 188 respectively to decrement the latter.

Outputs 187 and 191 are further connected to OR gates 176 and 170 respectively. In the manner described above, the signals appearing on these outputs are applied to the latter gates and serve to energize X and Y drives 54 and 58 respectively in synchronism with the pulses provided by clock 174. Thus, each pulse applied to one of the stepping motors 54 and 58 advances the energized motor by a rotational increment which causes stage 34 to be moved incrementally in the appropriate X or Y direction. The process continues until counters 184 and 188 are decremented to zero, representative of the fact that start position 12 has been reached, i.e. that stage 34 is positioned at the first station where an exposure is to be made.

When the zero count is reached in respective counters 184 and 188, gates 180 and 182 cut off and outputs 189 and 193 of flip-flops 186 and 190 respectively become active, both being connected to an AND gate 196. The latter gate becomes conductive and a resultant output signal is applied to an OR gate 198 and thence to an air pressure flip-flop 200. Output 202 of flip-flop 200 becomes active so as to apply a signal to air dump valve control circuit 204, adapted to close air dump valve 104. Simultaneously, a signal is applied to air pressure valve control circuit 205 which serves to open air pressure valve 106.

As previously explained, the process of closing the air dump valve and opening the air pressure valve causes bag 102 to be inflated. This action raises upper stage portion 38 to bring photopolymeric film 96 into contact with negative 88. Output 202 is further connected to a delay circuit 208 which assures that an appropriate delay circuit 208 which assures that an appropriate delay interval elapses to enable bag 102 to inflate the required amount. The output signal of delay circuit 208 activates a one shot circuit 210 whose output signal serves to close light control switch 110 for an interval that varies in duration with the chosen period of one shot circuit 210. Thus, the exposure time of light-sensitive film 96 may be varied depending on the requirements of the particular situation.

The inverted output signal of one shot 210 is applied to the reset input of flip-flop 200. After the time interval imposed by one shot 210 has expired, flip-flop 200 is reset and output 212 becomes active. The latter is connected to control circuit 204 and causes the latter to open dump valve 104. Similarly, the signal on output 212 is applied to control circuit 206 and serves to close pressure valve 106. As a consequence of the foregoing action, the air in bag 102 will now exhaust so as to collapse the bag. Consequently, upper stage portion 38 is lowered and again causes film 96 to be spaced from negative 88 by the distance of spacing 114, as shown in FIG. 5. Thus, the image transfer at station 12 having been completed, stage 34 is ready to move to the next station along its pre-selected path.

As stage portion 38 is lowered to its down position, switch 45 is depressed and the resultant output signal is applied to one input of an AND gate 214. Another input of the latter gate receives the inverted output signal of one shot 210. Unless gate 214 is conductive, output 217 of a further stage position flip-flop 216 is active and applies a signal to terminal 155. The latter signal serves to disable gates 154 and 156 and to energize warning light 123. When gate 214 becomes conductive, a signal is applied to stage position flip-flop 216. By way of output 219, which is connected to one input of an AND gate 218, a signal is applied to one input of the latter gate. Gate 218 further receives the inverted output signal appearing on output 212 of flip-flop 200, as well as the output signal of an X interval counter 220. The construction and operation of counter 220 in conjunction with its corresponding thumb wheel switch 126 is substantially identical to the circuit illustrated and described in connection with FIG. 7.

Unless signals are received on all three inputs of AND gate 218, the gate remains non-conductive. In the absence of an input signal, output 223 of X interval counter flip-flop 222 is active and applies a signal to the connected input of AND gate 224. Another input of the latter gate is connected to the output of an X increment counter 226 which, together with thumb wheel switch 122, is similar in construction and operation to the circuit illustrated and described in conjunction with FIG. 7.

As long as the X increment count is greater than zero, gate 224 remains conductive and applies a signal to a subsequently connected X increment counter flip-flop 228. One output 229 of the latter flip-flop is connected to OR gate 176. Thus, signals applied from flip-flop 228 to gate 176 serve to step X drive 54 along in synchronism with pulses from clock 174, substantially in the manner described above. Simultaneously, X increment counter 226 is decremented in clock synchronism from the output of AND gate 230, one of whose inputs is connected to the aforesaid output 229 of flip-flop 228. The other input of gate 230 is coupled to clock 174.

When X increment counter 226 decrements to zero, i.e. when the interval between station 12 and the subsequent station along the selected path has been completely traversed, gate 224 becomes non-conductive and causes output 231 of flip-flop 228 to become active. The latter output is connected to counter 226 and the signal thus applied serves to reset this counter to its original count. Output 231 is further connected to counter 220 and the signal thus applied serves to decrement the count by one indicative of the fact that the first X interval has been traversed by stage 34 and the stage is now positioned at the second station along the path.

Output 231 is further connected to OR gate 198 so as to energize flip-flop 200 when the output becomes active. This action again starts the above-described operation of bringing film 96 into contact with negative 88 followed by an exposure. Thus, at the conclusion of this operation, two distinct portions of film 96, the relative positions of which are precisely determined, have been exposed to image 89 of negative 88. The operation continues as described above, until station 13 is reached. At this point in time the count of X interval counter 220 has been decremented to zero.

The inverted output of counter 220 is connected to one input of an AND gate 232. A further input of the latter gate is connected to the output of Y interval counter 234. The latter, together with its corresponding thumb wheel switch 182, constitutes a circuit substantially identical to that shown in FIG. 7. Counter 234 applies a signal to gate 232 as long as the Y interval count is greater than zero. Thus, gate 232 becomes conductive and a signal is applied to Y interval counter flip-flop 236 which is connected to the output of gate 232. Output 237 of flip-flop 236, which is connected to one input of an AND gate 238, now becomes active. A further input of the latter gate is connected to the output of Y increment counter 240, which is constructed and cooperates with thumb wheel switch 124 substantially in the manner described in connection with FIG. 7.

As long as the count in counter 240 is greater than zero, an output signal is applied to gate 238. With both of its inputs active, gate 238 becomes conductive and applies an input signal to subsequently connected Y increment counter flip-flop 242, causing output 243 of the latter flip-flop to become active. The resultant signal is applied to OR gate 170 and, by way of the path previously described, a pulse is applied to Y drive 58 to step stage 34 along by one Y increment. Simultaneously, the signal on output 243 is applied to one input of an AND gate 244 which has another input connected to clock 174. Thus, the output of gate 244 becomes active, each pulse decrementing Y increment counter 240.

The aforesaid action continues until counter 240 is decremented to zero and gate 238 is rendered non-conductive. At that point flip-flop 242 is switched and its other output 245 becomes active. The latter output is connected to the reset input of Y increment counter 240, to the decrementing input of Y interval counter 234 and to a polarity inverting circuit 246. Thus, the signal on output 245 serves to reset counter 240 to its original pre-set count; to decrement the Y interval count by 1; and to render polarity inverting circuit 246 active so as to reverse the polarity of future output signals received from gate 154 and applied to the X drive.

Outut 245 is further connected to an input of OR gate 198. Thus, when output 245 becomes active, the resultant signal applied to gate 198 sets off the sequence of events previously described, which results in making an exposure of the image on the portion of light-sensitive film 96 which is positioned opposite negative 88 when stage 34 is at station 15.

The operation described above, which applies to the travel of stage 34 between stations 12 and 13, repeats for the travel of the stage between stations 15 and 17, provided only that the direction of travel in the X direction is reversed from what it was before.

When stage 34 reaches station 14, Y interval counter 234, as well as X interval counter 220, have both decremented to zero. Gate 218 is rendered non-conductive and output 221 of flip-flop 222 becomes active. Similarly, gate 232 is rendered nonconductive and output 239 of flip-flop 236 becomes active. After the delay period for making an exposure at station 14 has expired, the inverted output of the signal appearing at terminal 201 becomes active. The latter terminal, together with outputs 221 and 239, is connected to an AND gate 252, the output of which is connected to OR gate 166. Thus, gate 252 is rendered conductive and, by way of gate 166, a signal is applied to an AND gate 168 together with the inverted output of home position switces 37. Gate 168 is thus rendered conductive and applies suitable output signals to OR gates 170 and 176. In the manner described above, the output signals of the latter gates are applied to the X and Y drives respectively and stage 34 is driven in step increments back to its home position. When the latter position is reached, the inverted input signal from switches 37 becomes inactive, gate 168 is rendered non-conductive and stage 34 comes to a halt.

From the foregoing discussion it will be apparent that the present invention provides a step-and-repeat registration system whereby a light-sensitive film may be quickly and accurately positioned with respect to a stationary negative. Thus, different portions of the film, precisely located with respect to each other, can be exposed to the negative in any desired orthogonal grid pattern. Within the contemplated scope of the invention various modifications and substitutions will now occur to those skilled in the art.

For example, various rearrangements of the position of the ways shown in FIG. 2 may be made. Similarly, the lead screws and their connected drive motors may be positioned in any way that is suitable to the particular physical arrangement. Although the use of an inflatable bag is contemplated, other arrangements are possible for bringing the light-sensitive film into contact with the negative. For example, threaded pins may be employed which engage corresponding threaded bores in at least the upper stage portion. By selectively rotating such pins, the upper stage portion may be raised or lowered with respect to the lower stage portion.

The invention is not limited to the path outlined in FIG. 1. Other paths may be followed by stage 34 encompassing more or fewer stations, depending only on the requirements of each particular situation. Similarly, the invention is not limited to the implementation of the control system illustrated in FIG. 6, the latter being exemplary only to illustrate the manner in which the present system may fully automatically follow a path such as the one illustrated in FIG. 1. Applicant's invention is further capable of operating manually or semi-automatically, by overriding selected functions.

Further modifications, substitutions and equivalents will now occur to those skilled in the art, all of which fall within the spirit and scope of the present invention, as defined by the appended claims.

What is claimed is:

1. Apparatus for repeatedly bringing a substantially planar movable light-sensitive sheet into registration with a substantially planar stationary sheet having at least a portion thereof at least partially transmissive to light so as to define a pattern thereon, said stationary sheet being mounted parallel to said movable sheet and normally spaced therefrom, said apparatus comprising:
   a frame;
   a cover including a transparent pane, hingedly mounted on same frame and movable between an open and closed position;
   a pair of spaced, parallel tapes spanning said frame for selectively mounting said stationary sheet in any one of a plurality of fixed positions relative to said frame;
   means for mounting said stationary sheet to said tapes in any one of said plurality of fixed positions;
   a stage including a first stage portion for supporting said movable sheet in confronting relation with said stationary sheet, a second stage portion and means for coupling said first and second stage portions so as to permit said first stage portion to move relative to said second stage in a direction normal to the plane of said movable sheet;
   means for selectively moving said stage relative to said frame in either one of two orthogonal directions within the plane defined by said movable sheet; and
   means for selectively moving said first stage portion relative to said second stage portion in said normal direction so as to fixedly position said stationary sheet between said transparent pane and said movable sheet.

2. The apparatus of claim 1 wherein said tapes each include a plurality of precisely spaced holes and said means for mounting said stationary sheet comprises; a plurality of locating buttons engaging selected holes of said tapes through registering holes in said stationary sheet.

3. The apparatus of claim 2 and further comprising:

first and second tape mounting blocks affixed to said frame at opposite ends thereof;

said first tape mounting block including a plurality of precisely spaced holes;

said second tape mounting block comprising a plurality of pivoted block inserts each including a hole positioned opposite a hole of said first tape mounting block;

a plurality of tape locating pins each engaging a selected hole of said tape mounting blocks through registering holes in said tapes; and a plurality of leaf springs mounted on said frame, said leaf springs resiliently urging said pivotable block inserts to a position adapted to maintain tension in said tapes.

4. The apparatus of claim 1, wherein said means for selectively moving said stage relative to said frame comprises:

a first pair of ways mounted on opposite sides of said frame parallel to a first of said orthogonal directions;

a movable block slidably disposed on each of said first pair of ways;

a second pair of ways connecting said movable blocks parallel to a second of said orthogonal directions, said second pair of ways slidably mating with said second stage portion;

a first lead screw mounted on said frame parallel to said first orthogonal direction and adapted to drive said slidable blocks along said first pair of ways; and a second lead screw mounted on one of said movable blocks parallel to said second orthogonal direction and adapted to drive said second stage portion along said second pair of ways.

5. The apparatus of claim 1 wherein said stage portions include a pair of mutually facing surfaces substantially parallel to said sheets;

said coupling means comprising a plurality of curvilinear leaf springs connecting said stage portions, said leaf springs urging said surfaces to a prdetermined spacing and permitting relative movement of said stage portions substantially only in said normal direction;

an inflatable bag interposed between said facing surfaces; and means for selectively inflating and exhausting said bag to vary said spacing between said surfaces;

whereby said movable sheet is brought from its normally spaced position relative to said stationary sheet to a position adjacent the latter when said bag is inflated.

6. The appratus of claim 5 wherein said stage portions include like pluralities of precisely spaced holes in registry with each other; said movable sheet including holes in registry with at least some of said last-recited holes; said apparatus further including means for mounting said movable sheet to said first stage portion and comprising a plurality of locating pins each inserted into a set of registering holes of said sheet and said stage portions, said locating pins being adapted to act as guides during relative movement of said stage portions in said normal direction.

7. The apparatus of claim 5 wherein said tapes are positioned in a substantially common plane above said stage;

said apparatus further comprising;

a resilient pad positioned between said movable sheet and said first stage portion;

said pad being adapted to urge said movable sheet resiliently against said stationary sheet when said bag is inflated, and said stationary sheet against said transparent pane when said cover is in said closed position.

8. The apparatus of claim 7 wherein said stationary sheet includes a negative or a diapositive image and wherein said movable sheet comprises a photopolymeric film; said apparatus further comprising:

illuminating means for selectively projecting said negative or diapositive image onto said photopolymeric film at each of said stations to fix said image on different portions of said photopolymeric film upon exposure by said illuminating means.

9. The apparatus of claim 5 and further comprising:

a separate stepping motor corresponding to each of said lead screws and adapted to impart successive increments of rotation thereto to move said stage in equal step increments in the corresponding orthogonal direction;

means for pulsing said stepping motors;

first and second counting means corresponding to said first and second orthogonal directions respectively;

means for setting a preselected initial count in said first and second counting means representative of the number of said step increments in the corresponding orthogonal direction required to be traversed by said stage to reach the station at which it is to be positioned next;

means responsive to said pulsing means for decrementing said pre-selected initial count in each of said counting means; and means for deenergizing respective ones of said stepping motors upon the occurrence of a predetermined count in said first and second counting means respectively indicative of the traversal by said stage of said number of step increments in the corresponding orthogonal direction.

10. The apparatus of claim 9 wherein the distance intervals separating successive stations along a given orthogonal direction consist of equal numbers of step increments;

said apparatus further comprising:

third and fourth counting means corresponding respectively to said first and second orthogonal directions;

means for setting a count in each of said third and fourth counting means representative of the number of said intervals in the corresponding orthogonal direction required to be traversed to successively position said stage at each of said pre-selected stations;

means responsive to each occurrence of said predetermined count in said first and second counting means respectively for decrementing by one the count stored in the corresponding one of said third and fourth counting means;

means responsive to each decrementing action of said third and fourth counting means respectively for resetting said pre-selected initial count in the corresponding one of said first and second counting means; and means responsive to each decrementing action of said fourth counting means for reversing the polarity of one of said stepping motors responsible for movement of said stage in said first orthogonal direction.

11. The apparatus of claim 10 wherein said stage has a normal home position; and further comprising:
fifth and sixth counting means corresponding respectively to said first and second orthogonal directions;
means for setting an offset count in respective ones of said fifth and sixth counting means representative of the number of step increments in the corresponding orthogonal direction of the offset distance between said home position and the first one of said pre-selected stations;
means responsive to said pulsing means for decrementing said offset count in each of said fifth and sixth counting means; and
means responsive to the occurrence of a predetermined count in said fifth and sixth counting means respectively for deenergizing respective ones of said stepping motors indicative of the traversal by said stage of said offset distance in the corresponding orthogonal direction.

12. A step and repeat registration system for transporting a light-sensitive film in first and second mutually perpendicular directions in a predetermined plane to a succession of predetermined stations opposite a stationary image bearing sheet, said system being further adapted to position a corresponding select portion of said film adjacent said stationary sheet at each of said stations, said stations being spaced equidistantly from each other in each of said perpendicular directions; said system comprising:
a frame;
means for mounting said stationary sheet in a plane substantially parallel to said predetermined plane and in a selected fixed position relative to said frame;
a first pair of ways mounted parallel to said first direction on opposite sides of said frame;
a second pair of ways mounted parallel to said second direction and slidably positioned on said first pair of ways;
a stage movably mounted on said second pair of ways below said stationary sheet, said stage comprising first and second superposed stage portions including a pair of mutually facing surfaces;
said second pair of ways slidably engaging said first stage portion;
said second stage portion being adapted to carry said film normally spaced from said stationary sheet and substantially parallel thereto;
means for flexibly coupling said stage portions in a manner urging said facing surfaces to a predetermined mutual spacing;
means for moving said stage in equal step increments in said mutually perpendicular directions to successive ones of said stations;
means interposed between said surfaces for selectively increasing the spacing between said surfaces at respective ones of said stations to urge a select portion of said film substantially into contact with said stationary sheet against the force of said coupling means;
a pair of tape mounting blocks affixed to the front and back surfaces of said frame opposite each other, one of said mounting blocks including a plurality of precisely spaced holes, the other one of said mounting blocks including a plurality of pivotable block inserts each containing a hole positioned opposite a hole of said one mounting block;
a pair of parallel tapes spanning said frame in a horizontal plane and being spaced from each other, each tape including a plurality of precisely spaced holes;
a plurality of tape locating pins each engaging one of said tape holes in registry with a hole in a mounting block;
spring means resiliently urging each of said pivotable block inserts to a position adapted to maintain tension in the corresponding tape;
said stationary image-bearing sheet including at least a portion at least partially transmissive to light so as to define an image and a plurality of precisely spaced holes positioned at the edge of said sheet;
means engaging one of said tape holes through a registering hole in said stationary sheet;
a cover hingedly mounted on said frame, said cover including a transparent pane adapted to bear against the upper surface of said stationary sheet when said cover is closed; and
illumination means selectively adapted to project said image onto said film when the latter makes contact with said sheet.

13. The apparatus of claim 12 wherein said stage further includes a resilient pad positioned between said second stage portion and said film, said first and second stage portions and said pad each include a like plurality of registration holes corresponding to a like plurality of holes provided in said film;
a plurality of film locating pins each for engaging a registration hole of each of said first and second stage portions, said pad and said film;
said flexible coupling means comprising a plurality of curvilinear leaf springs connecting said stage portions and permitting substantially only vertical motion therebetween;
said means interposed between said surfaces comprising an inflatable bag; and
means for selectively inflating and exhausting said bag to vary the spacing between said surfaces;
wherein said resilient pad is adapted to urge said film into contact with one side of said stationary sheet when said bag is inflated; and said film locating pins act as guides during said vertical motion of said second stage portion.

14. The apparatus of claim 12 wherein said means for moving said stage in equal step increments comprises:
a lead screw affixed to said frame, extending in said first direction and adapted to move said second pair of ways forward and backward in said first direction and to position said second pair of ways at a first selected coordinate relative to said frame;
a lead screw extending in said second direction, mounted to move with said second pair of ways and adapted to move said stage forward and backward in said second direction and to position said stage at a second selected coordinate relative to said frame;
a stepping motor coupled to each of said lead screws;
means for selectively pulsing each of said stepping motors; and
means for sequentially positioning said stage at each of said succession of stations by forwardly traversing in said first direction all stations located at said second coordinate before backwardly traversing all stations located at the next succeeding coordinate in said first direction.

15. A step and repeat system comprising:
an open frame;
a stage mounted for movement within said frame;
means for moving said stage in its plane in two mutually orthogonal directions;
said stage including first and second portions held separated from one another by resilient means, and means disposed between said portions for expanding the separation uniformly against said resilient means;
a transparent pane mounted on said frame and movable to an operative position substantially parallel to the plane of said flat stage and spaced therefrom;
first mounting means positioned on said stage for holding light-sensitive material in a precisely defined position on the surface of said stage;
second mounting means positioned at opposite sides of said frame;
at least a pair of thin tapes mountable between respective second mounting means to extend substantially parallel to and spaced from said stage between the latter and said pane when the latter is in said operative position; and
third mounting means positioned on said tapes for holding in a precisely defined position sheet material, having at least a partially transmissive portion so as to define an image pattern, therebetween when the tapes are mounted on said second mounting means.

16. The apparatus of claim 15 wherein said resilient means is adapted to constrin relative motion of sais first and second portions substantially to a direction normal to said plane.

17. Apparatus for registering, in succession, each of a plurality of preselected portions of a photosensitive first substantially planar sheet, with second substantially planar sheet material having at least a portion thereof at least partially transmissive to light so as to define a predetermined pattern thereon, said apparatus comprising:
a frame;
means for fixedly mounting said second sheet in a fixed position relative to said frame substantially constrained against motion;
first means for moving said first sheet in each of first and second orthogonal directions in a plane substantially parallel to the plane of said second sheet to a succession of a plurality of preselected stations corresponding to said plurality of preselected portions of said first sheet, said first means including a stage positioned for movement relative to said frame in said orthogonal directions, said stage including a first stage portion for supporting said first sheet and a second stage portion; and
second means, selectively operable at each of said stations, for moving said first sheet in a direction normal to its plane to a position proximate said second sheet so that said second sheet is in registration with the corresponding preselected portion of said first sheet; wherein said second means comprises means for coupling said stage portions together and for permitting said first stage portion to move relative to said second stage portion in said normal direction toward said second sheet, said means for coupling said stage portions together comprising spring means for resiliently biasing said stage portions toward one another; an inflatable bag interposed between said stage portions; and means for selectively inflating and exhausting said bag to vary the relative spacing between said stage portions and to respectively move said first stage portion toward and away from said second sheet.

18. The apparatus according to claim 17, wherein said stage further includes a resilient pad mounted on said first stage portion for supporting said first sheet in a substantially planar manner and for resiliently urging said first sheet toward said second sheet when said first sheet is moved to a position proximate said second sheet.

19. The apparatus according to claim 17, wherein said spring means for resiliently biasing said stage portions toward one another includes a plurality of leaf springs connecting said stage portions.

20. The apparatus according to claim 17, further including a frame, means for fixedly mounting said second sheet relative to said frame, and means, fixed with respect to said frame, for illuminating said second sheet so as to project said predetermined pattern onto a preselected portion of said first sheet when said second sheet is in registration with said preselected portion of said first sheet.

21. The apparatus according to claim 20, wherein said means for fixedly mounting said second sheet includes means for mounting said second sheet in a selective one of a plurality of fixed positions.

22. The apparatus according to claim 21, wherein said means for mounting said second sheet in a selective one of a plurality of fixed positions comprises a pair of spaced, parallel tapes spanning said frame and means for attaching said second sheet to said tapes in any one of said plurality of fixed positions.

23. The apparatus according to claim 22, wherein said pair of tapes each include a plurality of precisely spaced holes, and said means for attaching said second sheet to said tape includes a plurality of locating buttons engaging selected holes of said tapes through appropriate registering holes in said second sheet.

24. The apparatus according to claim 20, wherein said means for illuminating said second sheet includes a cover, hingedly mounted on said frame and pivotable between an open and closed position, said cover including a transparent pane adapted to pivot with said cover so as to bear against said second sheet when said cover is pivoted to said closed position so that said second sheet can be exposed through said pane by a source of illumination fixedly mounted with respect to said frame.

25. The apparatus according to claim 24, wherein said first means includes a stage movable in said orthogonal directions and a resilient pad carried by said stage for supporting said first sheet and for resiliently urging said first sheet toward said second sheet and said second sheet toward said pane when said second sheet is moved to a position proximate said second sheet.

26. The apparatus according to claim 24, wherein said first means includes a stage, said stage comprising a first stage portion for supporting said first sheet, a second stage portion and means coupling said stage portions together so that said first stage portion is movable relative to said second stage portion in said normal direction toward said second sheet and said second sheet is pressed between said preselected portion of said first sheet and said pane with substantially equal pressure in the plane of said second sheet.

27. The apparatus according to claim 26, further including an inflatable bag interposed between said first and second stage portions, and means for selectively inflating and exhausting said bag to vary the relative spacing between said stage portions and to respectively move the preselected portion of said second sheet toward and away from said second sheet.

* * * * *

UNITED STATES PATENT AND TRADEMARK OFFICE
CERTIFICATE OF CORRECTION

PATENT NO. : 4,142,794
DATED : March 6, 1979
INVENTOR(S) : Dennis H. Trump

It is certified that error appears in the above-identified patent and that said Letters Patent are hereby corrected as shown below:

Claim 3, column 13, line 6, the word "pivoted" should be --pivotable--.

Claim 16, column 17, line 31, the word "sais" should be --said--.

Signed and Sealed this

Twenty-fourth Day of July 1979

[SEAL]

Attest:

*Attesting Officer*

LUTRELLE F. PARKER
*Acting Commissioner of Patents and Trademarks*